US012750044B2

(12) United States Patent
Lai

(10) Patent No.: US 12,750,044 B2
(45) Date of Patent: Sep. 29, 2026

(54) SYSTEM, DEVICE, AND METHOD FOR TRANSFORMING A SINGLE-ENDED INPUT SIGNAL INTO DIFFERENTIAL OUTPUT SIGNALS

(71) Applicant: Taiwan Semiconductor Manufacturing Company, Ltd., Hsinchu (TW)

(72) Inventor: Samson Lai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 28 days.

(21) Appl. No.: 18/612,148

(22) Filed: Mar. 21, 2024

(65) Prior Publication Data

US 2025/0300645 A1 Sep. 25, 2025

(51) Int. Cl.

*H03K 5/00* (2006.01)
*H03K 3/356* (2006.01)
*H03K 5/133* (2014.01)
*H03K 19/0185* (2006.01)

(52) U.S. Cl.

CPC ....... *H03K 5/133* (2013.01); *H03K 3/356008* (2013.01); *H03K 19/018507* (2013.01)

(58) Field of Classification Search

CPC ...... H03K 5/151; H03K 5/1515; H03K 5/133; H03K 3/356008; H03K 19/018507

See application file for complete search history.

(56) References Cited

U.S. PATENT DOCUMENTS 5,341,048 A * 8/1994 Randhawa ........... H03K 17/693 327/295
6,292,042 B1 * 9/2001 Kim ....................... H03K 5/151 327/257
6,700,420 B2 * 3/2004 Spehar ................ H04L 25/0272 327/161
7,378,876 B2 * 5/2008 Vu ....................... H03K 5/1515 326/82
7,570,095 B2 * 8/2009 Kim ................... H03K 5/15013 327/256
8,653,874 B2 * 2/2014 Sato ....................... H03K 5/151 327/231
10,749,508 B1 * 8/2020 Jain ........................ H03K 3/017
11,294,416 B1 * 4/2022 Mikes ................ H03K 17/6874

(Continued)

FOREIGN PATENT DOCUMENTS

CN 112910427 A 6/2021
CN 116505928 A 7/2023

(Continued)

OTHER PUBLICATIONS

Taiwan Office Action; Application No. 113118009; Dated Jan. 8, 2025.

*Primary Examiner* — Tuan T Lam
(74) *Attorney, Agent, or Firm* — Jones Day

(57) ABSTRACT

A device includes a converting circuit, a buffering circuit, and a routing circuit. The converting circuit is configured to transform a single-ended input signal into differential output signals. The buffering circuit is configured to amplify the differential output signals. The routing circuit is configured to route the single-ended input signal to an output of the converting circuit and has a shorter signal propagation delay than the converting circuit.

20 Claims, 10 Drawing Sheets

(56) References Cited

U.S. PATENT DOCUMENTS

| | | | | |
|---|---|---|---|---|
| 12,057,840 | B1 * | 8/2024 | Yu | H03K 19/20 |
| 2002/0167333 | A1 * | 11/2002 | Usui | H03K 5/151 326/86 |
| 2006/0066377 | A1 * | 3/2006 | Davis | G06F 1/10 327/295 |
| 2008/0265964 | A1 * | 10/2008 | Park | H03K 19/018528 327/257 |
| 2010/0327940 | A1 | 12/2010 | Eisenstadt et al. | |
| 2013/0188428 | A1 * | 7/2013 | Ma | H03K 3/0375 327/202 |
| 2016/0142026 | A1 | 5/2016 | Kim | |
| 2019/0328369 | A1 | 10/2019 | Igarashi et al. | |

FOREIGN PATENT DOCUMENTS

| | | | |
|---|---|---|---|
| CN | 117579040 | A | 2/2024 |
| EP | 1852972 | A1 | 11/2007 |

* cited by examiner

300

SYSTEM, DEVICE, AND METHOD FOR TRANSFORMING A SINGLE-ENDED INPUT SIGNAL INTO DIFFERENTIAL OUTPUT SIGNALS

BACKGROUND

A single-to-differential converter transforms a single-ended input signal into differential output signals. In a single-ended signaling scheme, data is encoded by variations in voltage levels with respect to a reference point, e.g., ground. Single-ended signaling is more susceptible to noise compared to differential signaling. A differential signaling scheme encodes data through voltage differences between two complementary output signals and has a better common-mode rejection, making single-to-differential converters essential in data communication systems.

BRIEF DESCRIPTION OF THE DRAWINGS

Aspects of the present disclosure are best understood from the following detailed description when read with the accompanying figures.

DETAILED DESCRIPTION

Figure 1:
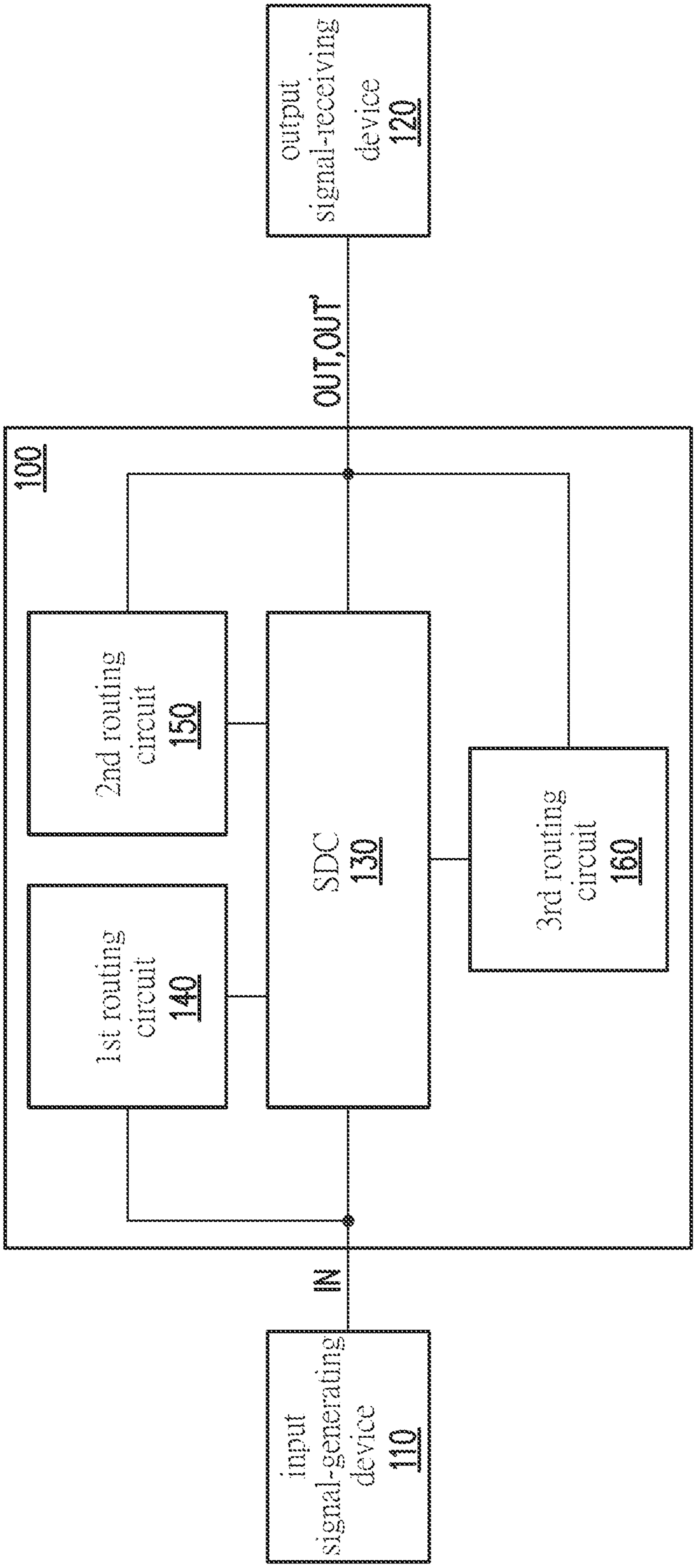
FIG. 1 is a block diagram of an exemplary embodiment of a system in accordance with the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A sampling circuit samples or captures a value, e.g., a high (or low) state of a bit, of a data signal at a certain point in time, e.g., during a rising edge of a clock signal. That is, a data signal is sampled when a rising (or falling) edge of a clock signal a high (or low) state of a bit of a data signal is aligned with. Such an alignment is ensured using a delay locked loop that requires synchronization between the data and clock signals. is ensured using a delay locked loop connected between a vlaFor example, the sample circuit samples a bit of the data signal when a rising (or falling) edge of the clock signal is aligned with a portion of the bit between a rising (or falling edge) and a falling (or rising edge) of the bit. Such an alignment is ensured using a delay locked loop. However, the particular, data data-processing device receives data from a data signal-generating device and processes a data receives transsingle-to-differential converter converts or transforms a single-ended input signal into complementary output signals (e.g., OUT, OUT'). The duty cycle of the complementary output signals in conventional approaches significantly deviates from the ideal 50%. Additionally, in conventional approaches, the delay between the rising (or falling) edge of the complementary output signal (OUT) and the falling (or rising) edge of the complementary output signal (OUT') is undesirably long.

The approaches of the instant disclosure provide systems, devices, and methods for generating complementary output signals that eliminate or mitigate these deficiencies of the conventional approaches. In certain embodiments, systems and methods include a signal receiver, e.g., signal receiver of FIG. 1, that sam and, a data-processing transmitter, and data-processing device, e.g., data-processing device of FIG. 1, that receives data from a data signal-generating device and that transmits data to a data-signal receiving device. and=a and first, second, and third routing circuits 140, 150, 160. The SDC 130 converts or transforms a single-ended input signal (IN) into complementary output signals (OUT, OUT'). At least one of the first, second, and third routing circuits 140, 150, 160 contributes to a substantially 50% duty cycle, e.g., between about 49% duty cycle and about 51% duty cycle, for the complementary output signals (OUT, OUT') and a relatively short delay, e.g., between about −1 ps and about 1 ps, between the rising (or falling) edge of the complementary output signal (OUT) and the falling (or rising) edge of the complementary output signal (OUT'). For example, the SDC 130 includes a converting circuit, e.g., converting circuit 210 of FIG. 2, that converts or transforms the single-ended input signal (IN) into differential output signals (DS, DS'). The first routing circuit 140 is connected across the converting circuit 210 and facilitates the conversion of the single-ended input signal (IN) into the differential output signal (DS') at substantially the same time as the conversion of the single-ended input signal (IN) into the differential output signal (DS), in a manner that will be described hereinafter.

FIG. 1 is a block diagram of an exemplary embodiment of a device in accordance with the present disclosure. As illustrated in FIG. 1, the device 100 includes a receiver first and second signal-amplifying circuits 110, 120, a delay circuit 130, a clock calibration circuit 140, and a sampling circuit 150., data-processing circuit 120 device includes an input signal-generating device 110 and an output signal-receiving device 120 and a device 100 connected between the input signal-generating device 110 and the output signal-receiving device 120. The input signal-generating device 110 generates a single-ended input signal (IN). In this exemplary embodiment, the device 100 includes a single-to-differential converter (SDC) 130 and first, second, and third routing circuits 140, 150, 160. The SDC 130 converts or transforms (i) the signal-ended input signal (IN) into differential output signals, e.g., differential output signals (DS, DS') of FIG. 2, that are substantially a hundred and eighty degrees out of phase from each other, e.g., logical 0 and 1, and (ii) the differential output signals (DS, DS') into complementary output signals (OUT, OUT') that are amplified versions of the differential output signals (DS, DS'), respectively. The output-signal receiving device 120 receives the complementary output signals (OUT, OUT').

The first routing circuit 140 facilitates the transformation of the single-ended input signal (IN) into the differential output signal (DS') at substantially the same time as the transformation of the single-ended input signal (IN) into the differential output signal (DS). Each of the second and third routing circuits 150, 160 facilitates the faster transformation of a respective one of the differential output signals (DS, DS') into a respective one of the complementary output signals (OUT, OUT'). In further detail, FIG. 2 is a circuit diagram of the first exemplary embodiment of a device 100 in accordance with the present disclosure.

Figure 2:
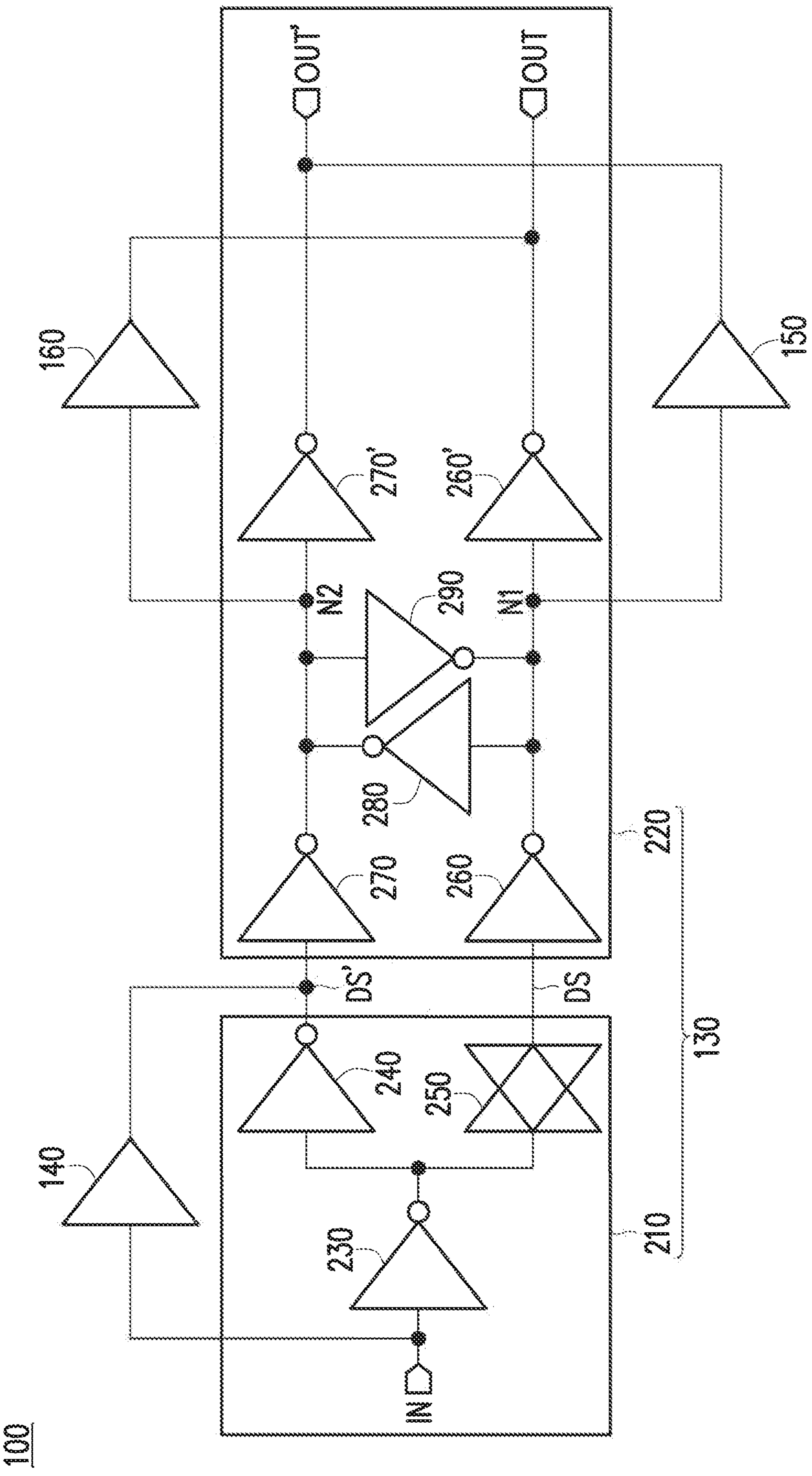
FIG. 2 is a circuit diagram of the first exemplary embodiment of a device in accordance with the present disclosure.

As illustrated in FIG. 2, the SDC 130 includes a converting circuit 210 and a buffering circuit 220. The converting circuit 210 converts or transforms the single-ended input signal (IN) into differential output signals (DS, DS'). In this exemplary embodiment, the converting circuit 210 includes first and second inverters 230, 240 and a transmission gate 250. The first inverter 230 isolates the device 100 from a device, e.g., the input-signal generating device 150 (see FIG. 1), external to the device 100, receives the single-ended input signal (IN), and generates an inverted version of the single-ended input signal (IN).

The transmission gate 250 is connected between the first inverter 230 and the buffering circuit 220. When enabled by the control signals at the control terminals of the transmission gate 250, the inverted version of the single-ended input signal (IN) flows from the input of the transmission gate to the output of the transmission gate 250. The inverted version of the single-ended input signal (IN) at the output of the transmission gate 250 serves as the differential output signal (DS). Conversely, when disabled by the control signals at the control terminals of the transmission gate 250, the transmission gate 250 does not permit flow of the inverted version of the single-ended input signal (IN) therethrough. The second inverter 240 is connected between the first inverter 230 and the buffering circuit 220, receives the inverted version of the single-ended input signal (IN), and generates the differential output signal (DS').

Various configurations for the converting circuit 210 are contemplated in further embodiments, so long as such various configurations achieve the intended purpose described above for the converting circuit 210.

The buffering circuit 220 isolates the device 100 from a device, e.g., the output signal-receiving device 160 (see FIG. 1), external to the device 100, amplifies the differential output signals (DS, DS'), and generates the complementary output signals (OUT, OUT'). In this exemplary embodiment, the buffering circuit 220 includes a first pair of inverters 260, 260', a second pair of inverters 270, 270', and a third pair of inverters 280, 290. The first pair of inverters 260, 260' is connected in series to the output of the transmission gate 250 of the converting circuit 210, amplifies the differential output signal (DS), and generates the complementary output signal (OUT).

The second pair of inverters 270, 270' is connected in series to the output of the second inverter 240 of the converting circuit 210, amplifies the differential output signal (DS'), and generates the complementary output signal (OUT'). The third pair of inverters 280, 290 is connected in a cross-coupled manner between a first node (N1) between the first pair of inverters 260, 260' and a second node (N2) between the second pair of inverters 270, 270' and adjusts the inverted version of the differential output signal (DS) closer to logical 0 (or 1) and the inverted version of the differential output signal (DS') closer to logical 1 (or 0).

Various configurations for the buffering circuit 220 are contemplated in further embodiments, so long as such various configurations achieve the intended purpose described above for the buffering circuit 220.

Inverters have a longer signal propagation delay than transmission gates. As such, the single-ended input signal (IN) traverses through the first and second inverters 230, 240 of the converting circuit 210 slower than through the first inverter 230 and the transmission gate 250 of the converting circuit 210. That is, the differential output signal (DS) arrives at the output of the transmission gate 250 of the converting circuit 210 earlier than the differential output signal (DS') at the output of the second inverter 240 of the converting circuit 210. This distorts the duty cycle of the complementary output signals (OUT, OUT'), i.e., causes the duty cycle of the complementary output signal (OUT, OUT') to deviate from the ideal 50% duty cycle, and undesirably lengthens the delay between the rising (or falling) edge of the complementary output signal (OUT) and the falling (or rising) edge of the complementary output signal (OUT').

The first routing circuit 140 ensures the substantially simultaneous arrival of the differential output signal (DS) at the output of the transmission gate 250 of the converting circuit 210 and the differential output signal (DS') at the output of the second inverter 240 of the converting circuit 210. For example, the first routing circuit 140 is connected between the input of the first inverter 230 of the converting circuit 210 and the output of the second inverter 240 of the converting circuit 210 and has a shorter signal propagation delay than the first and second inverters 230, 240 of the converting circuit 210. This shorter signal propagation delay of the first routing circuit 140 compensates for the longer signal propagation delay of the first and second inverters 230, 240 of the converting circuit 210. That is, the signal propagation delay of the first and second inverters 230, 240 of the converting circuit 210 and the first routing circuit 140 is substantially equal to the average of the shorter signal propagation delay of the first routing circuit 140 and the longer signal propagation delay of the first and second inverters 230, 240 of the converting circuit 210. This allows the substantially simultaneous arrival of the differential output signal (DS) at the output of the transmission gate 250 of the converting circuit 210 and the differential output signal (DS') at the output of the second inverter 240 of the converting circuit 210. This helps in minimizing, if not in elimination, of the distortion to the duty cycle of the complementary output signal (OUT, OUT') and the delay between the rising (or falling) edge of the complementary output signal (OUT) and the falling (or rising) edge of the complementary output signal (OUT').

In this exemplary embodiment, the first routing circuit 140 includes a buffer. For example, the buffer includes a transistor, e.g., a field-effect transistor, in a source-follower structure and having a gate terminal connected to the input of the first inverter 230 of the converting circuit 210, a source terminal connected to the output of the second inverter 240 of the converting circuit 210, and a drain terminal connected to ground.

Various configurations for the first routing circuit 140 are contemplated in further embodiments, so long as such various configurations achieve the intended purpose described above for the first routing circuit 140. For example, in some embodiments, instead of the buffer, the first routing circuit 140 includes a resistor. In such some embodiments, the first resistor terminal of the resistor is connected to the input of the first inverter 230 of the converting circuit 210 and the second resistor terminal of the resistor is connected to the output of the second inverter 240 of the converting circuit 210. In other embodiments, instead of the buffer, the first routing circuit 140 includes a transmission gate. In such other embodiments, the transmission gate has an input connected to the input of the first inverter 230 of the converting circuit 210, an output connected to the output of the second inverter 240 of the converting circuit 210, and a pair of control terminals, each receiving a control signal that enables or disables passage of the single-ended input signal (IN) therethrough.

The second routing circuit 150 expedites the arrival of the complementary output signal (OUT') at the output of the second pair of inverters 270, 270' of the buffering circuit 220. For example, the second routing circuit 150 is connected between the first node (N1) and the output of the second pair of inverters 270, 270' of the buffering circuit 220. The inverter 260 of the first pair of inverters 260, 260' of the buffering circuit 220 and the second routing circuit 150 has a shorter signal propagation delay than the second pair of inverters 270, 270' of the buffering circuit 220. This shorter signal propagation delay of the inverter 260 of the first pair of inverters 260, 260' of the buffering circuit 220 and the second routing circuit 150 compensates for the longer signal propagation delay of the second pair of inverters 270, 270' of the buffering circuit 210. That is, the signal propagation delay of the inverter 260 of the first pair of inverters 260, 260' of the buffering circuit 220, the second pair of inverters 270, 270' of the buffering circuit 220, and the second routing circuit 150 is substantially equal to the average of the shorter signal propagation delay of the inverter 260 of the first pair of inverters 260, 260' of the buffering circuit 220 and the second routing circuit 150 and the longer signal propagation delay of the second pair of inverters 270, 270' of the buffering circuit 220. This expedites the arrival of the complementary output signal (OUT') at the output of the second pair of inverters 270, 270'. This helps in minimizing, if not in elimination, of the distortion to the duty cycle of the complementary output signal (OUT, OUT') and the delay between the rising (or falling) edge of the complementary output signal (OUT) and the falling (or rising) edge of the complementary output signal (OUT').

In this exemplary embodiment, the second routing circuit 150 includes a buffer. For example, the buffer includes a transistor, e.g., a field-effect transistor, in a source-follower structure and having a gate terminal connected to the first node (N1), a source terminal connected to the output of the second pair of inverters 270, 270' of the buffering circuit 220, and a drain terminal connected to ground.

Various configurations for the second routing circuit 150 are contemplated in further embodiments, so long as such various configurations achieve the intended purpose described above for the second routing circuit 150. For example, in some embodiments, instead of the buffer, the second routing circuit 150 includes a resistor. In such some embodiments, the first resistor terminal of the resistor is connected to the first node (N1) and the second resistor terminal of the resistor is connected to the output of the second pair of inverters 270, 270' of the buffering circuit 220. In other embodiments, instead of the buffer, the second routing circuit 150 includes a transmission gate. In such other embodiments, the transmission gate has an input connected to the first node (N1), an output connected to the output of the second pair of inverters 270, 270' of the buffering circuit 220, and a pair of control terminals, each receiving a control signal that enables or disables passage of the inverted version of the differential output signal (DS) therethrough.

Similarly, the third routing circuit 160 expedites the arrival of the complementary output signal (OUT) at the output of the first pair of inverters 260, 260' of the buffering circuit 220. For example, the third routing circuit 160 is connected between the second node (N2) and the output of the first pair of inverters 260, 260' of the buffering circuit 220. The inverter 270 of the second pair of inverters 270, 270' of the buffering circuit 220 and the third routing circuit 160 has a shorter signal propagation delay than the first pair of inverters 260, 260' of the buffering circuit 220. This shorter signal propagation delay of the inverter 270 of the second pair of inverters 270, 270' of the buffering circuit 220 and the third routing circuit 160 compensates for the longer signal propagation delay of the first pair of inverters 260, 260' of the buffering circuit 210. That is, the signal propagation delay of the first pair of inverters 260, 260' of the buffering circuit 220, the inverter 270 of the second pair of inverters 270, 270' of the buffering circuit 220, and the third routing circuit 160 is substantially equal to the average of the shorter signal propagation delay of the inverter 270 of the second pair of inverters 270, 270' of the buffering circuit 220 and the third routing circuit 160 and the longer signal propagation delay of the first pair of inverters 260, 260' of the buffering circuit 220. This expedites the arrival of the complementary output signal (OUT) at the output of the first pair of inverters 260, 260'. This helps in minimizing, if not in elimination, of the distortion to the duty cycle of the complementary output signals (OUT, OUT') and the delay between the rising (or falling) edge of the complementary output signal (OUT) and the falling (or rising) edge of the complementary output signal (OUT').

In this exemplary embodiment, the third routing circuit 160 includes a buffer. For example, the buffer includes a transistor, e.g., a field-effect transistor, in a source-follower structure and having a gate terminal connected to the second node (N2), a source terminal connected to the output of the first pair of inverters 260, 260' of the buffering circuit 220, and a drain terminal connected to ground.

Various configurations for the third routing circuit 160 are contemplated in further embodiments, so long as such various configurations achieve the intended purpose described above for the third routing circuit 160. For example, in some embodiments, instead of the buffer, the third routing circuit 160 includes a resistor. In such some embodiments, the first resistor terminal of the resistor is connected to the second node (N2) and the second resistor terminal of the resistor is connected to the output of the first pair of inverters 260, 260' of the buffering circuit 220. In other embodiments, instead of the buffer, the third routing circuit 160 includes a transmission gate. In such other embodiments, the transmission gate has an input connected to the second node (N2), an output connected to the output of the first pair of inverters 260, 260' of the buffering circuit 220, and a pair of control terminals, each receiving a control signal that enables or disables passage of the inverted version of the differential output signal (DS') therethrough.

In some embodiments, the third routing circuit 160 has substantially the same signal propagation delay as the second routing circuit 150. In another embodiments, the third routing circuit 160 has a shorter or longer signal propagation delay than the second routing circuit 150.

Figure 3:
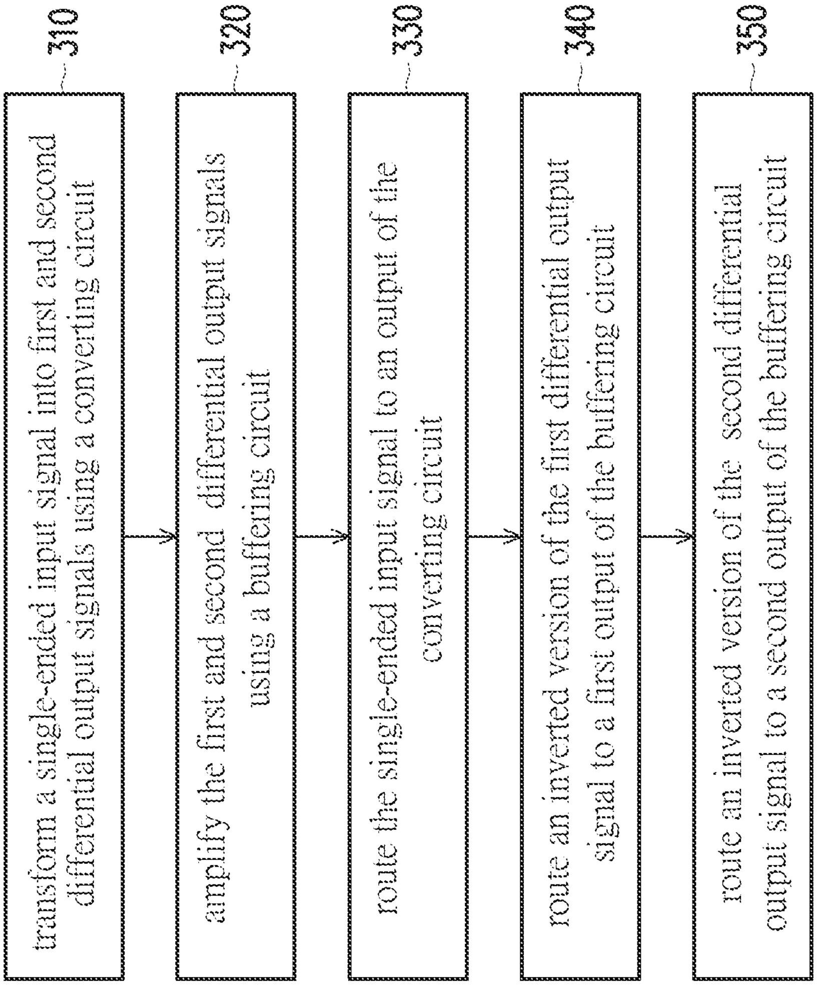
FIG. 3 is a flow chart of the first exemplary embodiment of a method for transforming a single-ended input signal into complementary output signals in accordance with the present disclosure.

FIG. 3 is a flow chart of the first exemplary embodiment of a method 300 for converting or transforming a single-ended input signal into complementary output signals in accordance with the present disclosure. The example method 300 will now be described with further reference to FIGS. 1 and 2 for ease of understanding. It is understood that the method 300 is applicable to structures other than those of FIGS. 1 and 2. Further, it is understood that additional operations can be provided before, during, and after the method 300, and some of the operations described below can be replaced or eliminated, in an alternative embodiment of the method 300.

In operation 310, the converting circuit 210 converts or transforms a single-ended input signal (IN) into differential output signals (DS, DS'). At this time, the single-ended input signal (IN) traverses through the first and second inverters 230, 240 of the converting circuit 210 slower than through the first inverter 230 and the transmission gate 250 of the converting circuit 210. That is, the differential output signal (DS) arrives at the output of the transmission gate 250 of the converting circuit 210 earlier than the differential output signal (DS') at the output of the second inverter 240 of the converting circuit 210.

In operation 320, the buffering circuit 220 amplifies the differential output signals (DS, DS') and generates complementary output signals (OUT, OUT'), respectively. At this time, the differential output signal (DS) traverses through the first pair of inverters 260, 260' of the buffering circuit 220, whereas and the differential output signal (DS') traverses through the second pair of inverters 270, 270' of the buffering circuit 220.

In operation 330, the first routing circuit 140 routes the single-ended input signal (IN) from the input of the first inverter 230 of the converting circuit 210 to the output of the second inverter 240 of the converting circuit 210. At this time, the single-ended input signal (IN) traverses through the first routing circuit 140 faster than through the first and second inverters 230, 240 of the converting circuit 210. This faster signal propagation of the single-ended input signal (IN) through the first routing circuit 140 compensates for the slower signal propagation of the single-ended input signal (IN) through the first and second inverters 230, 240 of the converting circuit 210. That is, the signal propagation of the single-ended input signal (IN) through the first and second inverters 230, 240 of the converting circuit 210 and the first routing circuit 140 is substantially equal to the average of the faster signal propagation of the single-ended input signal (IN) through first routing circuit 140 and the slower signal propagation of the single-ended input signal (IN) through the first and second inverters 230, 240 of the converting circuit 210. This allows the substantially simultaneous arrival of the differential output signal (DS) at the output of the transmission gate 250 of the converting circuit 210 and the differential output signal (DS') at the output of the second inverter 240 of the converting circuit 210.

In operation 340, the second routing circuit 150 routes an inverted version of the differential output signal (DS) from the first node (N1) to the output of the second pair of inverters 270, 270' of the buffering circuit 220. At this time, the differential output signal (DS) traverses through the inverter 260 of the first pair of inverters 260, 260' of the buffering circuit 220 and the second routing circuit 150 faster than the differential output signal (DS') through the second pair of inverters 270, 270' of the buffering circuit 220. This faster signal propagation of the differential output signal (DS) through the inverter 260 of the first pair of inverters 260, 260' of the buffering circuit 220 and the second routing circuit 150 compensates for the slower signal propagation of the differential output signal (DS') through the second pair of inverters 270, 270' of the buffering circuit 220. This expedites the arrival of the complementary output signal (OUT') at the output of the second pair of inverters 270, 270'.

In operation 350, the third routing circuit 160 routes an inverted version of the differential output signal (DS') from the second node (N2) to the output of the first pair of inverters 260, 260' of the buffering circuit 220. At this time, the differential output signal (DS') traverses through the inverter 270 of the second pair of inverters 270, 270' of the buffering circuit 220 and the third routing circuit 160 faster than the differential output signal (DS) through the first pair of inverters 260, 260' of the buffering circuit 220. This faster signal propagation of the differential output signal (DS') through the inverter 270 of the second pair of inverters 270, 270' of the buffering circuit 220 and the third routing circuit 160 compensates for the slower signal propagation of the differential output signal (DS) through the first pair of inverters 260, 260' of the buffering circuit 220. This expedites the arrival of the complementary output signal (OUT) at the output of the first pair of inverters 260, 260' of the buffering circuit 220.

Although the device 100 is exemplified with three routing circuits 140, 150, 160, it should be understood that, after reading this disclosure, the number of routing circuits of the device 100 may be increased or decreased as desired. For example, FIG. 4 is a circuit diagram of the second exemplary embodiment of a device 400 in accordance with the present disclosure.

Figure 4:
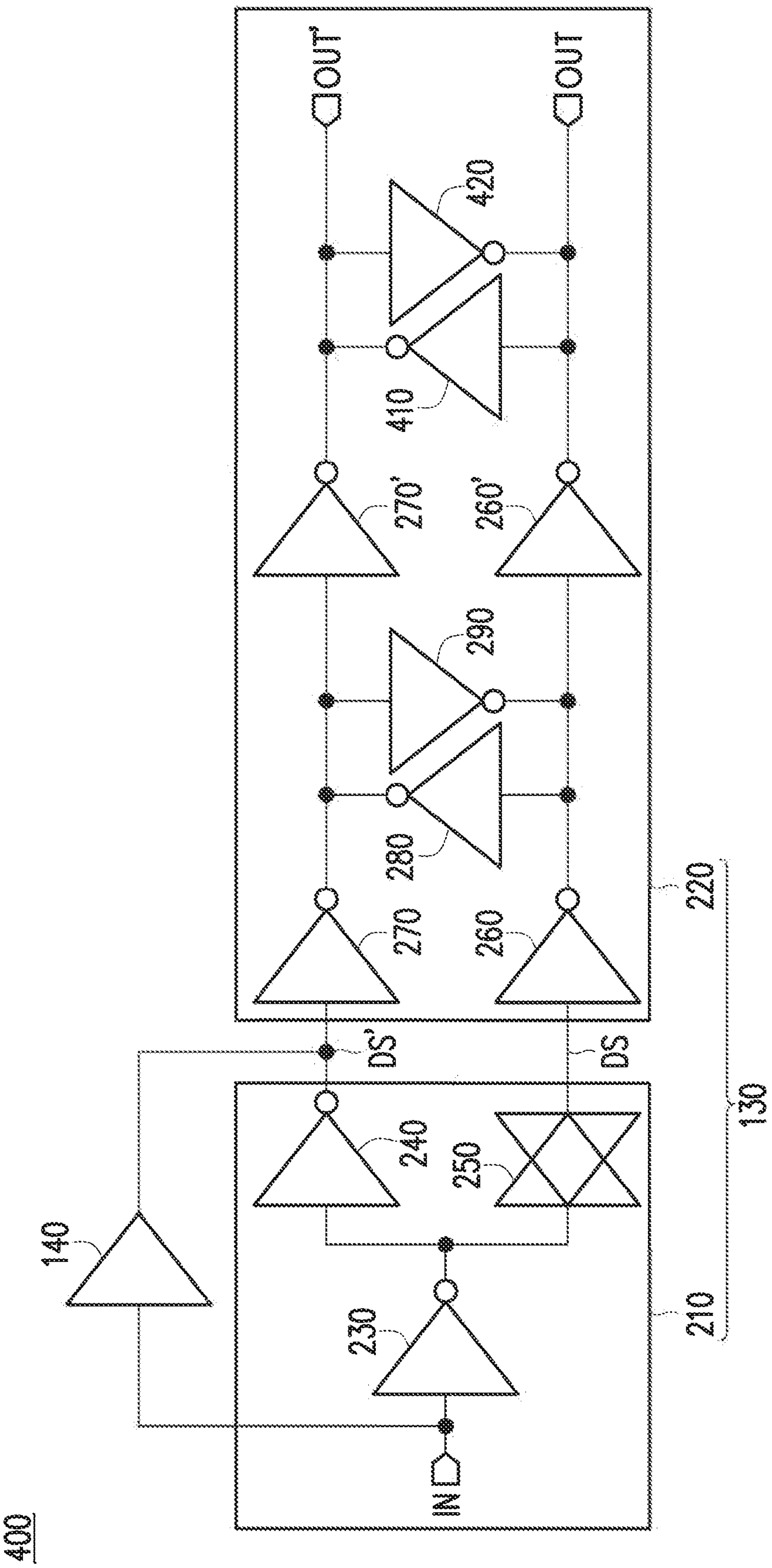
FIG. 4 is a circuit diagram of the second exemplary embodiment of a device in accordance with the present disclosure.

As illustrated in FIG. 4, the example device 400 differs from the example device 100 of FIG. 1 in that the device 400 includes the first routing circuit 140 and is dispensed with the second and third routing circuits 150, 160. A pair of inverters 410, 420 connected in a cross-coupled manner is between the output of the first pair of inverters 260, 260' of the buffering circuit 220 and the second pair of inverters 270, 270' of the buffering circuit 220. In some embodiments, the example device 400 includes at least one of the second and third routing circuits 150, 160 and is dispensed with the first routing circuit 140. In other embodiments, the example device 400 includes the first routing circuit 140 and one of the second and third routing circuits 150, 160 and is dispensed with the other of the second and third routing circuits 150, 160.

Because the operations of the device 400 are similar to those described above with respect to the device 100, a detailed description of the same is omitted herewith for the sake of brevity.

Figure 5:
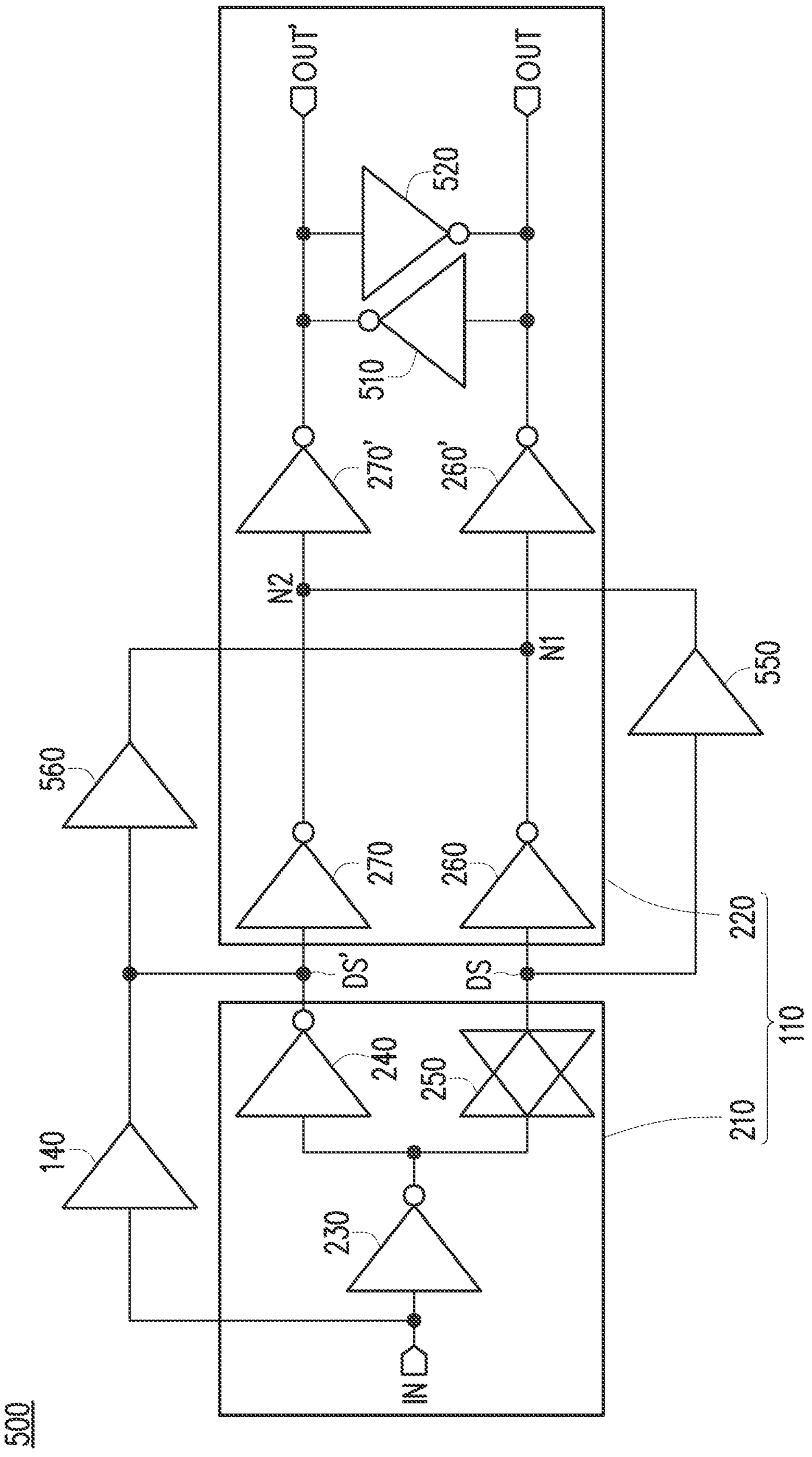
FIG. 5 is a circuit diagram of the third exemplary embodiment of a device in accordance with the present disclosure.

FIG. 5 is a circuit diagram of the third exemplary embodiment of a device 500 in accordance with the present disclosure. As illustrated in FIG. 5, the example device 500 differs from the example device 100 of FIG. 1 in that the second routing circuit 550 expedites the arrival of the inverted version of the differential output signal (DS') at the second node (N2). For example, the second routing circuit 550 is connected between the output of the transmission gate 250 of the converting circuit 210 and the second node (N2) and has a shorter signal propagation delay than the inverter 270 of the second pair of inverters 270, 270' of the buffering circuit 220. This shorter signal propagation delay of the second routing circuit 550 compensates for the longer signal propagation delay of the inverter 270 of the second pair of inverters 270, 270' of the buffering circuit 210. That is, the signal propagation delay of the inverter 270 of the second pair of inverters 270, 270' of the buffering circuit 220 and the second routing circuit 550 is substantially equal to the average of the shorter signal propagation delay of the second routing circuit 550 and the longer signal propagation delay of the inverter 270 of the second pair of inverters 270, 270' of the buffering circuit 220. This expedites the arrival of inverted version of the differential output signal (DS') at the second node (N2). This helps in minimizing, if not in elimination, of the distortion to the duty cycle of the complementary output signal (OUT, OUT') and the delay between the rising (or falling) edge of the complementary output signal (OUT) and the falling (or rising) edge of the complementary output signal (OUT').

In this exemplary embodiment, the second routing circuit 550 includes a buffer. For example, the buffer includes a transistor, e.g., a field-effect transistor, in a source-follower structure and having a gate terminal connected to the output of the transmission gate 250 of the converting circuit 210, a source terminal connected to the second node (N2), and a drain terminal connected to ground.

Various configurations for the second routing circuit 550 are contemplated in further embodiments, so long as such various configurations achieve the intended purpose described above for the second routing circuit 550. For example, in some embodiments, instead of the buffer, the second routing circuit 550 includes a resistor. In such some embodiments, the first resistor terminal of the resistor is connected to the output of the transmission gate 250 of the converting circuit 210 and the second resistor terminal of the resistor is connected to the second node (N2). In other embodiments, instead of the buffer, the second routing circuit 550 includes a transmission gate. In such other embodiments, the transmission gate has an input connected to the output of the transmission gate 250 of the converting circuit 210, an output connected to the second node (N2), and a pair of control terminals, each receiving a control signal that enables or disables passage of the differential output signal (DS) therethrough.

As also illustrated in FIG. 5, the example device 500 differs from the example device 100 of FIG. 1 in that the third routing circuit 560 expedites the arrival of the inverted version of the differential output signal (DS) at the first node (N1). For example, the third routing circuit 560 is connected between the output of the second inverter 240 of the converting circuit 210 and the first node (N1) and has a shorter signal propagation delay than the inverter 260 of the first pair of inverters 260, 260' of the buffering circuit 220. This shorter signal propagation delay of the third routing circuit 560 compensates for the longer signal propagation delay of the inverter 260 of the first pair of inverters 260, 260' of the buffering circuit 210. That is, the signal propagation delay of the inverter 260 of the first pair of inverters 260, 260' of the buffering circuit 220 and the third routing circuit 560 is substantially equal to the average of the shorter signal propagation delay of the third routing circuit 560 and the longer signal propagation delay of the inverter 260 of the first pair of inverters 260, 260' of the buffering circuit 220. This expedites the arrival of the inverted version of the differential output signal (DS) at the first node (N1). This helps in minimizing, if not in elimination, of the distortion to the duty cycle of the complementary output signal (OUT, OUT') and the delay between the rising (or falling) edge of the complementary output signal (OUT) and the falling (or rising) edge of the complementary output signal (OUT').

In this exemplary embodiment, the third routing circuit 560 includes a buffer. For example, the buffer includes a transistor, e.g., a field-effect transistor, in a source-follower structure and having a gate terminal connected to the output of the second inverter 240 of the converting circuit 210, a source terminal connected to the first node (N1), and a drain terminal connected to ground.

Various configurations for the third routing circuit 560 are contemplated in further embodiments, so long as such various configurations achieve the intended purpose described above for the third routing circuit 560. For example, in some embodiments, instead of the buffer, the third routing circuit 560 includes a resistor. In such some embodiments, the first resistor terminal of the resistor is connected to the output of the second inverter 240 of the converting circuit 210 and the second resistor terminal of the resistor is connected to the first node (N1). In other embodiments, instead of the buffer, the third routing circuit 560 includes a transmission gate. In such other embodiments, the transmission gate has an input connected to the output of the second inverter 240 of the converting circuit 210, an output connected to the first node (N1), and a pair of control terminals, each receiving a control signal that enables or disables passage of the differential output signal (DS') therethrough.

In some embodiments, the third routing circuit 560 has substantially the same signal propagation delay as the second routing circuit 550. In another embodiments, the third routing circuit 560 has a shorter or longer signal propagation delay than the second routing circuit 550.

As also illustrated in FIG. 5, the example device 500 differs from the example device 100 of FIG. 1 in that the device 500 includes a pair of inverters 510, 520 connected in a cross-coupled manner between the output of the first pair of inverters 260, 260' of the buffering circuit 220 and the output of the second pair of inverters 270, 270' of the buffering circuit 220 and is dispensed with the third pair of inverters 280, 290.

Figure 6:
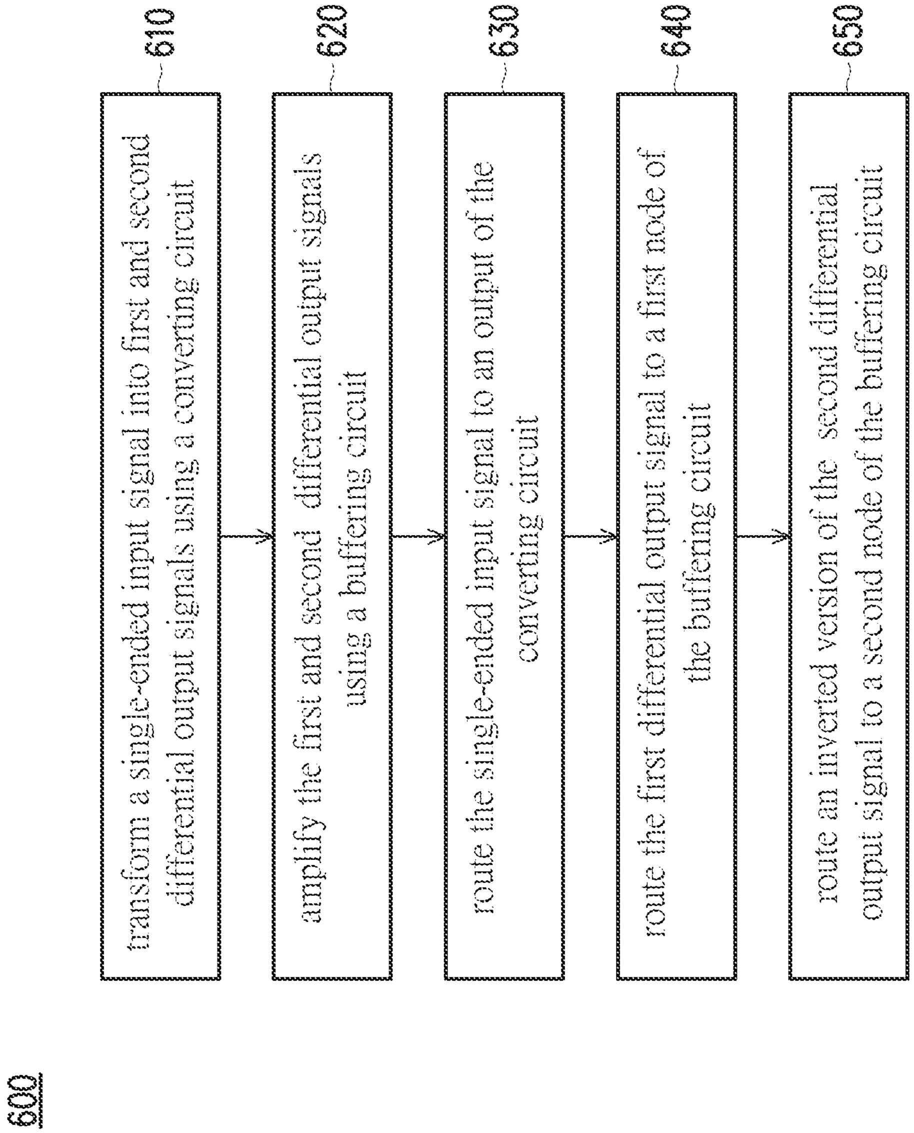
FIG. 6 is a flow chart of the second exemplary embodiment of a method for transforming a single-ended input signal into complementary output signals in accordance with the present disclosure.

FIG. 6 is a flow chart of the second exemplary embodiment of a method 600 of transforming a single-ended input signal into complementary output signals in accordance with the present disclosure. The example method 600 will now be described with further reference to FIGS. 1 and 5 for ease of understanding. It is understood that the method 600 is applicable to structures other than those of FIGS. 1 and 5. Further, it is understood that additional operations can be provided before, during, and after the method 600, and some of the operations described below can be replaced or eliminated, in an alternative embodiment of the method 600.

In operation 610, the converting circuit 210 converts or transforms a single-ended input signal (IN) into differential output signals (DS, DS'). At this time, the single-ended input signal (IN) traverses through the first and second inverters 230, 240 of the converting circuit 210 slower than through the first inverter 230 and the transmission gate 250 of the converting circuit 210. That is, the differential output signal (DS) arrives at the output of the transmission gate 250 of the converting circuit 210 earlier than the differential output signal (DS') at the output of the second inverter 240 of the converting circuit 210.

In operation 620, the buffering circuit 220 amplifies the differential output signals (DS, DS') and generates complementary output signals (OUT, OUT'). At this time, the differential output signal (DS) traverses through the first pair of inverters 260, 260' of the buffering circuit 220, whereas the differential output signal (DS') traverses through the second pair of inverters 270, 270' of the buffering circuit 220.

In operation 630, the first routing circuit 140 routes the single-ended input signal (IN) from the input of the first inverter 230 of the converting circuit 210 to the output of the second inverter 240 of the converting circuit 210. At this time, the single-ended input signal (IN) traverses through the first routing circuit 140 faster than through the first and second inverters 230, 240 of the converting circuit 210. This faster signal propagation of the single-ended input signal (IN) through the first routing circuit 140 compensates for the slower signal propagation of the single-ended input signal (IN) through the first and second inverters 230, 240 of the converting circuit 210. That is, the signal propagation of the single-ended input signal (IN) through the first and second inverters 230, 240 of the converting circuit 210 and the first routing circuit 140 is substantially equal to the average of the faster signal propagation of the single-ended input signal (IN) through first routing circuit 140 and the slower signal propagation of the single-ended input signal (IN) through the first and second inverters 230, 240 of the converting circuit 210. This allows the substantially simultaneous arrival of the differential output signal (DS) at the output of the transmission gate 250 of the converting circuit 210 and the differential output signal (DS') at the output of the second inverter 240 of the converting circuit 210.

In operation 640, the second routing circuit 550 routes the differential output signal (DS) from the output of the transmission gate 250 of the converting circuit 210 to the second node (N2). At this time, the differential output signal (DS) traverses through the second routing circuit 550 faster than the differential output signal (DS') through the inverter 270 of the second pair of inverters 270, 270' of the buffering circuit 220. This faster signal propagation of the differential output signal (DS) through the second routing circuit 550 compensates for the slower signal propagation of the differential output signal (DS') through the inverter 270 of the second pair of inverters 270, 270' of the buffering circuit 220. This expedites the arrival of the complementary output signal (OUT') at the output of the second pair of inverters 270, 270' of the buffering circuit 220.

In operation 650, the third routing circuit 560 routes the differential output signal (DS') from the output of the second inverter 240 of the converting circuit 210 to the first node (N1). At this time, the differential output signal (DS') traverses through the third routing circuit 560 faster than the differential output signal (DS) through the inverter 260 of the first pair of inverters 260, 260' of the buffering circuit 220. This faster signal propagation of the differential output signal (DS') through the third routing circuit 560 compensates for the slower signal propagation of the differential output signal (DS) through the inverter 260 of the first pair of inverters 260, 260' of the buffering circuit 220. This expedites the arrival of the complementary output signal (OUT) at the output of the first pair of inverters 260, 260' of the buffering circuit 220.

Figure 7:
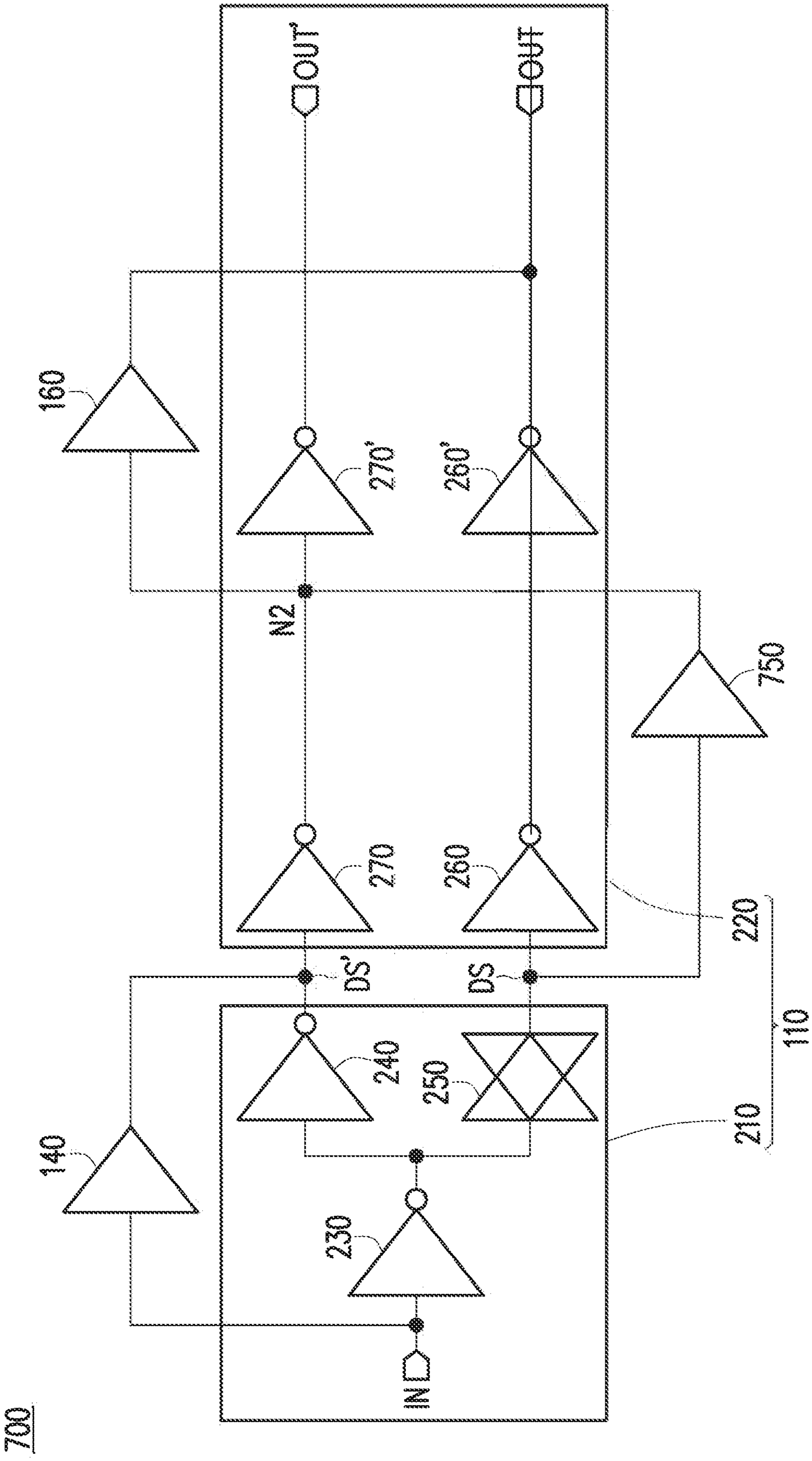
FIG. 7 is a circuit diagram of the fourth exemplary embodiment of a device in accordance with the present disclosure.

FIG. 7 is a circuit diagram of the fourth exemplary embodiment of a device 700 in accordance with the present disclosure. As illustrated in FIG. 7, the example device 700 differs from the example device 100 of FIG. 1 in that the second routing circuit 750 expedites the arrival of the inverted version of the differential output signal (DS') at the second node (N2). For example, the second routing circuit 750 is connected between the output of the transmission gate 250 of the converting circuit 210 and the second node (N2) and has a shorter signal propagation delay than the inverter 270 of the second pair of inverters 270, 270' of the buffering circuit 220. This shorter signal propagation delay of the second routing circuit 750 compensates for the longer signal propagation delay of the inverter 270 of the second pair of inverters 270, 270' of the buffering circuit 210. That is, the signal propagation delay of the inverter 270 of the second pair of inverters 270, 270' of the buffering circuit 220 and the second routing circuit 750 is substantially equal to the average of the shorter signal propagation delay of the second routing circuit 750 and the longer signal propagation delay of the inverter 270 of the second pair of inverters 270, 270' of the buffering circuit 220. This expedites the arrival of inverted version of the second differential output signal (DS') at the second node (N2). This helps in minimizing, if not in elimination, of the distortion to the duty cycle of the complementary output signal (OUT, OUT') and the delay between the rising (or falling) edge of the complementary output signal (OUT) and the falling (or rising) edge of the complementary output signal (OUT').

In this exemplary embodiment, the second routing circuit 750 includes a buffer. For example, the buffer includes a transistor, e.g., a field-effect transistor, in a source-follower structure and having a gate terminal connected to the output of the transmission gate of the converting circuit 210, a source terminal connected to the second node (N2), and a drain terminal connected to ground.

Various configurations for the second routing circuit 750 are contemplated in further embodiments, so long as such various configurations achieve the intended purpose described above for the second routing circuit 750. For example, in some embodiments, instead of the buffer, the second routing circuit 750 includes a resistor. In such some embodiments, the first resistor terminal of the resistor is connected to the output of the transmission gate 250 of the converting circuit 210 and the second resistor terminal of the resistor is connected to the second node (N2). In other embodiments, instead of the buffer, the second routing circuit 750 includes a transmission gate. In such other embodiments, the transmission gate has an input connected to the output of the transmission gate 250 of the converting circuit 210, an output connected to the second node (N2), and a pair of control terminals, each receiving a control signal that enables or disables flow of the differential output signal (DS) therethrough.

As also illustrated in FIG. 7, the example device 700 differs from the example device 100 of FIG. 1 in that the device 700 is dispensed with the third pair of inverters 280, 290.

In some embodiments, the third routing circuit 160 has substantially the same signal propagation delay as the second routing circuit 750. In another embodiments, the third routing circuit 160 has a shorter or longer signal propagation delay than the second routing circuit 750.

Figure 8:
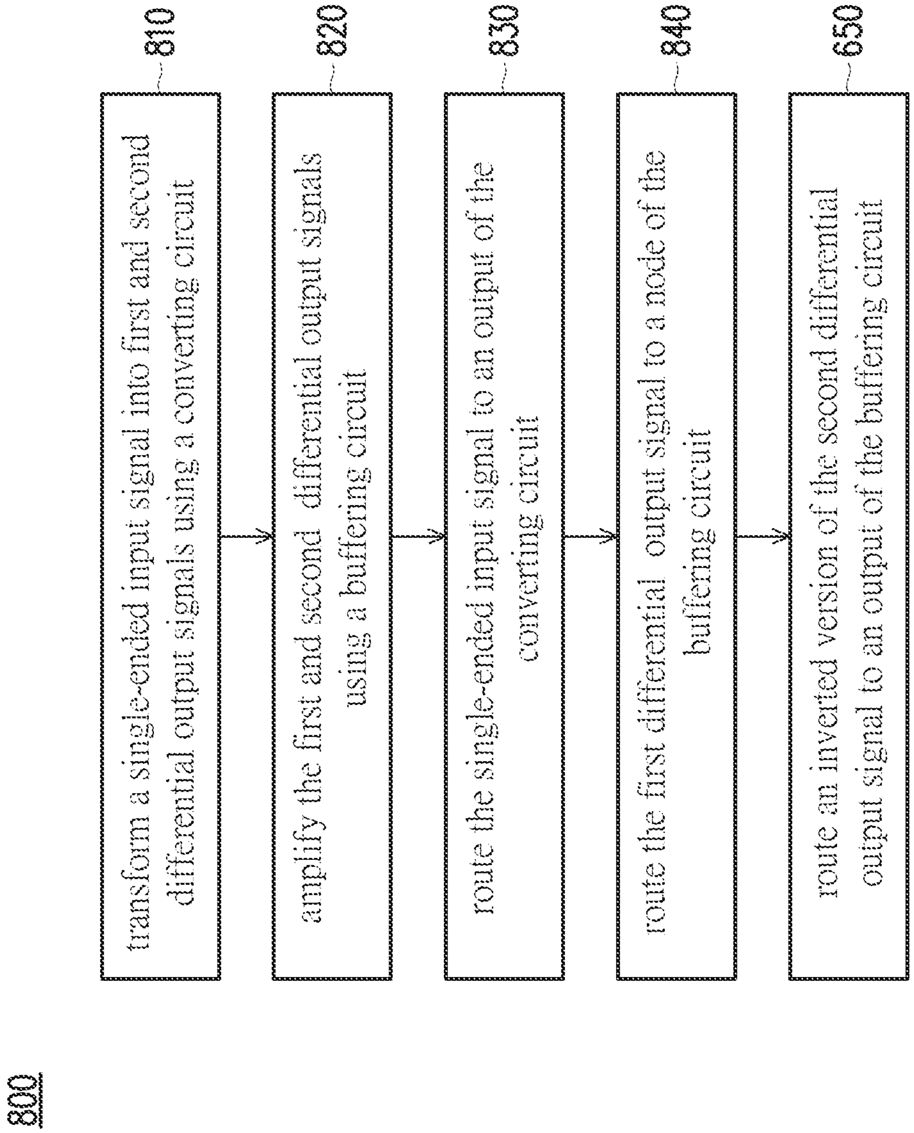
FIG. 8 is a flow chart of the third exemplary embodiment of a method for transforming a single-ended input signal into complementary output signals in accordance with the present disclosure.

FIG. 8 is a flow chart of the third exemplary embodiment of a method 800 of transforming a single-ended input signal into complementary output signals in accordance with the present disclosure. The example method 800 will now be described with further reference to FIGS. 1 and 7 for ease of understanding. It is understood that the method 800 is applicable to structures other than those of FIGS. 1 and 7. Further, it is understood that additional operations can be provided before, during, and after the method 800, and some of the operations described below can be replaced or eliminated, in an alternative embodiment of the method 800.

In operation 810, the converting circuit 210 converts or transforms a single-ended input signal (IN) into differential output signals (DS, DS'). At this time, the single-ended input signal (IN) traverses through the first and second inverters 230, 240 of the converting circuit 210 slower than through the first inverter 230 and the transmission gate 250 of the converting circuit 210. That is, the differential output signal (DS) arrives at the output of the transmission gate 250 of the converting circuit 210 earlier than the differential output signal (DS') at the output of the second inverter 240 of the converting circuit 210.

In operation 820, the buffering circuit 220 amplifies the differential output signals (DS, DS') and generates complementary output signals (OUT, OUT'). At this time, the differential output signal (DS) traverses through the first pair of inverters 260, 260' of the buffering circuit 220, whereas the differential output signal (DS') traverses through the second pair of inverters 270, 270' of the buffering circuit 220.

In operation 830, the first routing circuit 140 routes the single-ended input signal (IN) from the input of the first inverter 230 of the converting circuit 210 to the output of the second inverter 240 of the converting circuit 210. At this time, the single-ended input signal (IN) traverses through the first routing circuit 140 faster than through the first and second inverters 230, 240 of the converting circuit 210. This faster signal propagation of the single-ended input signal (IN) through the first routing circuit 140 compensates for the slower signal propagation of the single-ended input signal (IN) through the first and second inverters 230, 240 of the converting circuit 210. That is, the signal propagation of the single-ended input signal (IN) through the first and second inverters 230, 240 of the converting circuit 210 and the first routing circuit 140 is substantially equal to the average of the faster signal propagation of the single-ended input signal (IN) through first routing circuit 140 and the slower signal propagation of the single-ended input signal (IN) through the first and second inverters 230, 240 of the converting circuit 210. This allows the substantially simultaneous arrival of the differential output signal (DS) at the output of the transmission gate 250 of the converting circuit 210 and the differential output signal (DS') at the output of the second inverter 240 of the converting circuit 210.

In operation 840, the second routing circuit 750 routes the differential output signal (DS) from the output of the transmission gate 250 of the converting circuit 210 to the second node (N2). At this time, the differential output signal (DS) traverses through the second routing circuit 750 faster than the differential output signal (DS') through the inverter 270 of second pair of inverters 270, 270' of the buffering circuit 220. This faster signal propagation of the differential output signal (DS) through the second routing circuit 750 compensates for the slower signal propagation of the differential output signal (DS') through the inverter 270 of the second pair of inverters 270, 270' of the buffering circuit 220. This expedites the arrival of the complementary output signal (OUT') at the output of the second pair of inverters 270, 270. of the buffering circuit 220.

In operation 850, the third routing circuit 160 routes an inverted version of the differential output signal (DS) from the second node (N2) to the output of the first pair of inverters 260, 260' of the buffering circuit 220. At this time, the differential output signal (DS') traverses through the inverter 270 of the second pair of inverters 270, 270' of the buffering circuit 220 and the third routing circuit 160 faster than the differential output signal (DS) through the first pair of inverters 260, 260' of the buffering circuit 220. This faster signal propagation of the differential output signal (DS') through the inverter 270 of the second pair of inverters 270, 270' of the buffering circuit 220 and the third routing circuit 160 compensates for the slower signal propagation of the differential output signal (DS) through the first pair of inverters 260, 260 of the buffering circuit 220. This expedites the arrival of the complementary output signal (OUT) at the output of the first pair of inverters 260, 260' of the buffering circuit 220.

Figure 9:
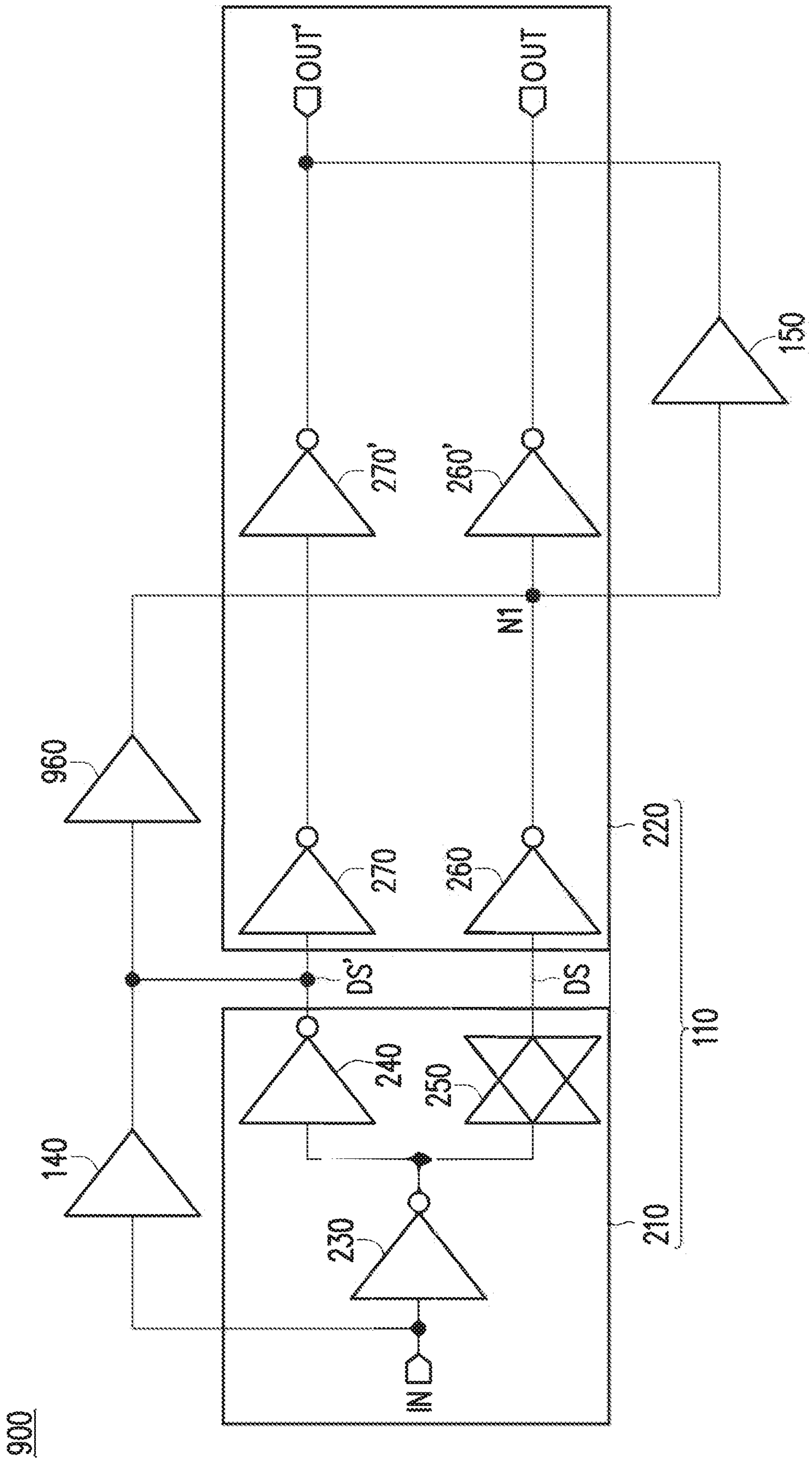
FIG. 9 is a circuit diagram of the fifth exemplary embodiment of a device in accordance with the present disclosure.

FIG. 9 is a circuit diagram of the fifth exemplary embodiment of a device 900 in accordance with the present disclosure. As illustrated in FIG. 9, the example device 900 differs from the example device 100 of FIG. 1 in that the third routing circuit 960 expedites the arrival of the inverted version of the differential output signal (DS) at the first node (N1). For example, the third routing circuit 960 is connected between the output of the second inverter 240 of the converting circuit 210 and the first node (N2) and has a shorter signal propagation delay than the inverter 260 of the first pair of inverters 260, 260' of the buffering circuit 220. This shorter signal propagation delay of the third routing circuit 960 compensates for the longer signal propagation delay of the inverter 260 of the first pair of inverters 260, 260' of the buffering circuit 210. That is, the signal propagation delay of the inverter 260 of the first pair of inverters 260, 260' of the buffering circuit 210 and the third routing circuit 960 is substantially equal to the average of the shorter signal propagation delay of the third routing circuit 960 and the longer signal propagation delay of the inverter 260 of the first pair of inverters 260, 260' of the buffering circuit 220. This expedites the arrival of inverted version of the differential output signal (DS) at the first node (N1). This helps in minimizing, if not in elimination, of the distortion to the duty cycle of the complementary output signal (OUT, OUT') and the delay between the rising (or falling) edge of the complementary output signal (OUT) and the falling (or rising) edge of the complementary output signal (OUT').

In this exemplary embodiment, the third routing circuit 750 includes a buffer. For example, the buffer includes a transistor, e.g., a field-effect transistor, in a source-follower structure and having a gate terminal connected to the output of the second inverter 240 of the converting circuit 210, a source terminal connected to the first node (N1), and a drain terminal connected to ground.

Various configurations for the third routing circuit 960 are contemplated in further embodiments, so long as such various configurations achieve the intended purpose described above for the third routing circuit 960. For example, in some embodiments, instead of the buffer, the third routing circuit 960 includes a resistor. In such some embodiments, the first resistor terminal of the resistor is connected to the output of the second inverter 240 of the converting circuit 210 and the second resistor terminal of the resistor is connected to the first node (N1). In other embodiments, instead of the buffer, the third routing circuit 960 includes a transmission gate. In such other embodiments, the transmission gate has an input connected to the output of the second inverter 240 of the converting circuit 210, an output connected to the first node (N1), and a pair of control terminals, each receiving a control signal that enables or disables passage of the differential output signal (DS') therethrough.

As also illustrated in FIG. 9, the example device 900 differs from the example device 100 of FIG. 1 in that the device 900 is dispensed with the third pair of inverters 280, 290.

In some embodiments, the third routing circuit 960 has substantially the same signal propagation delay as the second routing circuit 150. In another embodiments, the third routing circuit 960 has a shorter or longer signal propagation delay than the second routing circuit 150.

Figure 10:
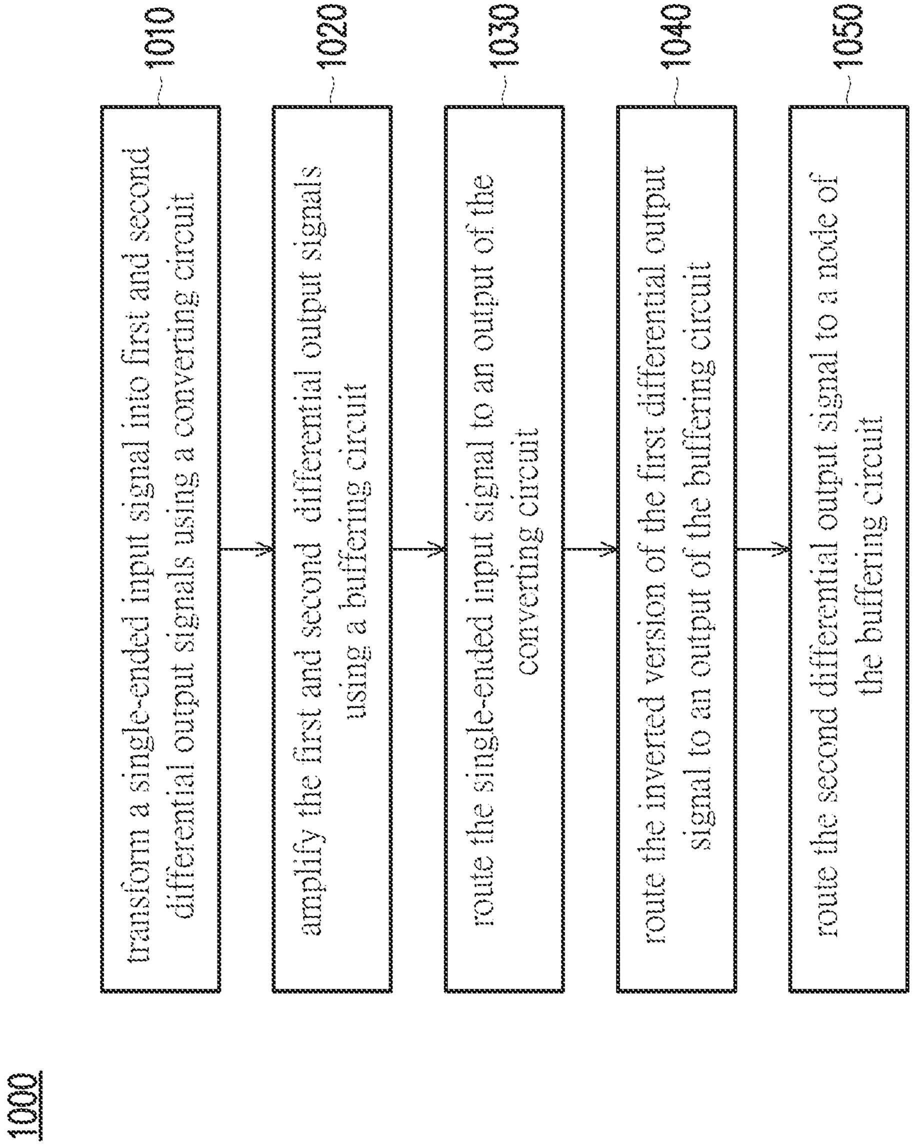
FIG. 10 is a flow chart of the fourth exemplary embodiment of a method for transforming a single-ended input signal into complementary output signals in accordance with the present disclosure.

FIG. 10 is a flow chart of the fourth exemplary embodiment of a method 1000 of transforming a single-ended input signal into complementary output signals in accordance with the present disclosure. The example method 1000 will now be described with further reference to FIGS. 1 and 9 for ease of understanding. It is understood that the method 1000 is applicable to structures other than those of FIGS. 1 and 9. Further, it is understood that additional operations can be provided before, during, and after the method 1000, and some of the operations described below can be replaced or eliminated, in an alternative embodiment of the method 1000.

In operation 1010, the converting circuit 210 converts or transforms a single-ended input signal (IN) into differential output signals (DS, DS'). At this time, the single-ended input signal (IN) traverses through the first and second inverters 230, 240 of the converting circuit 210 slower than through the first inverter 230 and the transmission gate 250 of the converting circuit 210. That is, the differential output signal (DS) arrives at the output of the transmission gate 250 of the converting circuit 210 earlier than the differential output signal (DS') at the output of the second inverter 240 of the converting circuit 210.

In operation 1020, the buffering circuit 220 amplifies the differential output signals (DS, DS') and generates complementary output signals (OUT, OUT'). At this time, the differential output signal (DS) traverses through the first pair of inverters 260, 260' of the buffering circuit 220, whereas the differential output signal (DS') traverses through the second pair of inverters 270, 270' of the buffering circuit 220.

In operation 1030, the first routing circuit 140 routes the single-ended input signal (IN) from the input of the first inverter 230 of the converting circuit 210 to the output of the second inverter 240 of the converting circuit 210. At this time, the single-ended input signal (IN) traverses through the first routing circuit 140 faster than through the first and second inverters 230, 240 of the converting circuit 210. This faster signal propagation of the single-ended input signal (IN) through the first routing circuit 140 compensates for the slower signal propagation of the single-ended input signal (IN) through the first and second inverters 230, 240 of the converting circuit 210. That is, the signal propagation of the single-ended input signal (IN) through the first and second inverters 230, 240 of the converting circuit 210 and the first routing circuit 140 is substantially equal to the average of the faster signal propagation of the single-ended input signal (IN) through first routing circuit 140 and the slower signal propagation of the single-ended input signal (IN) through the first and second inverters 230, 240 of the converting circuit 210. This allows the substantially simultaneous arrival of the differential output signal (DS) at the output of the transmission gate 250 of the converting circuit 210 and the differential output signal (DS') at the output of the second inverter 240 of the converting circuit 210.

In operation 1040, the second routing circuit 150 routes an inverted version of the differential output signal (DS) from the first node (N1) to the output of the second pair of inverters 270, 270' of the buffering circuit 220. At this time, the differential output signal (DS) traverses through the inverter 260 of the first pair of inverters 260, 260' of the buffering circuit 220 and the second routing circuit 150 faster than the differential output signal (DS') through the second pair of inverters 270, 270' of the buffering circuit 220. This faster signal propagation of the differential output signal (DS) through the inverter 260 of the first pair of inverters 260, 260' of the buffering circuit 220 and the second routing circuit 150 compensates for the slower signal propagation of the differential output signal (DS') through the second pair of inverters 270, 270' of the buffering circuit 220. This expedites the arrival of the complementary output signal (OUT') at the output of the second pair of inverters 270, 270' of the buffering circuit 220.

In operation 1050, the third routing circuit 960 routes the differential output signal (DS') from the output of the second inverter 240 of the converting circuit 210 to the first node (N1). At this time, the differential output signal (DS') traverses through the third routing circuit 960 faster than the differential output signal (DS) through the inverter 260 of the first pair of inverters 260, 260' of the buffering circuit 220. This faster signal propagation of the differential output signal (DS') through the third routing circuit 960 compensates for the slower signal propagation of the differential output signal (DS) through the inverter 260 of the first pair of inverters 260, 260' of the buffering circuit 220. This expedites the arrival of the complementary output signal (OUT) at the output of the first pair of inverters 260, 260' of the buffering circuit 220.

In an embodiment, a device comprises a converting circuit, a buffering circuit, and a routing circuit. The converting circuit is configured to transform a single-ended input signal into differential output signals. The buffering circuit is configured to amplify the differential output signals. The routing circuit is configured to route the single-ended input signal to an output of the converting circuit and has a shorter signal propagation delay than the converting circuit.

In another embodiment, a method comprises: transforming, by a converting circuit, a single-ended input signal into differential output signals; amplifying the differential output signals; and routing the single-ended input signal to an output of the converting circuit through a routing circuit that introduces a shorter signal propagation delay than the converting circuit.

In another embodiment, a system comprises first and second devices. The first device includes a converting circuit configured to transform a single-ended input signal into differential output signals, a buffering circuit configured to amplify the differential output signals and to generate complementary output signals, and a routing circuit configured to route one of the differential output signals to an output of the buffering circuit and has a shorter signal propagation delay than the buffering circuit. The second device is configured to generate the single-ended input signal or to receive the complementary output signals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

a converting circuit configured to transform a single-ended input signal into differential output signals and including a transmission gate configured to output one of the differential output signals;

a buffering circuit configured to amplify the differential output signals;

a first routing circuit (i) configured to route the single-ended input signal as the other of the differential output signals of the converting circuit, and (ii) having a shorter signal propagation delay than the converting circuit; and a second routing circuit configured to route one of the differential output signals to a first output of the buffering circuit.

2. The device of claim 1, wherein the first routing circuit includes a buffer having a transistor in a source-follower structure.

3. The device of claim 1, wherein the converting circuit includes:

a first inverter;

the transmission gate between the first inverter and the buffering circuit; and a second inverter between the first inverter and the buffering circuit, wherein the first routing circuit is between an input of the first inverter and an output of the second inverter.

4. The device of claim 1, wherein the second routing circuit has a shorter signal propagation delay than the buffering circuit.

5. The device of claim 4, further comprising a third routing circuit configured to route another of the differential output signals to a second output of the buffering circuit and having a shorter signal propagation delay than the buffering circuit.

6. The device of claim 1, wherein the second routing circuit is configured to route a first signal from a first node between a first input and a second output of the buffering circuit to the first output of the buffering circuit, and the device further comprises:

a third routing circuit configured to route a second signal from a second node between a second input and the first output of the buffering circuit to the second output of the buffering circuit.

7. The device of claim 6, wherein the buffering circuit comprises:

a first pair of inverters connected in series;

a second pair of inverters connected in series; and a third pair of inverters connected in a cross-coupled manner between the first node and the second node, wherein the first node is between the first pair of inverters, the second node is between the second pair of inverters, an output of the first pair of inverters is connected to the second output of the buffering circuit, and an output of the second pair of inverters is connected to the first output of the buffering circuit.

8. A method comprising:

transforming, by a converting circuit, a single-ended input signal into differential output signals;

generating, by a transmission gate, one of the differential output signals;

amplifying, by a buffering circuit, the differential output signals; and routing the single-ended input signal as the other of the differential output signals of the converting circuit through a first routing circuit that introduces a shorter signal propagation delay than the converting circuit; and routing one of the differential output signal to a first output of the buffering circuit through a second routing circuit.

9. The method of claim 8, wherein the routing is such that the single-ended input signal traverses through a buffer.

10. The method of claim 9, wherein the buffer includes a transistor in a source-follower structure.

11. The method of claim 8, wherein the transforming is such that the single-ended input signal traverses through an inverter and the transmission gate.

12. The method of claim 8, wherein the transforming is such that the single-ended input signal traverses through a pair of inverters.

13. A system comprising:

a first device including:

a converting circuit configured to transform a single-ended input signal into differential output signals and including a transmission gate configured to output a first one of the differential output signals;

a buffering circuit configured to amplify the differential output signals and to generate complementary output signals;

a first routing circuit (i) configured to route the single-ended input signal as a second one of the differential output signals of the converting circuit, and having a shorter signal propagation delay than the converting circuit; and a second routing circuit configured to route the first one of the differential output signals to a first output of the buffering circuit; and a second device configured to generate the single-ended input signal or to receive the complementary output signals.

14. The system of claim 13, wherein the first routing circuit includes a buffer.

15. The system of claim 14, wherein the buffer includes a transistor in a source-follower structure.

16. The system of claim 13, wherein the second routing circuit has a shorter signal propagation delay than the buffering circuit.

17. The system of claim 16, wherein:

the buffering circuit includes a first pair of inverters connected in series between a first output of the converting circuit and a second output of the buffering circuit and a second pair of inverters connected in series between a second output of the converting circuit and the first output of the buffering circuit; and the second routing circuit is connected between a first node between the first pair of inverters and the first output of the buffering circuit.

18. The system of claim 17, wherein a third routing circuit is connected between a second node between the second pair of inverters and the second output of the buffering circuit.

19. The system of claim 18, further comprising cross-coupled inverters connected between the first and second nodes.

20. The system of claim 13, wherein the converting circuit includes:

a first inverter;

the transmission gate between the first inverter and the buffering circuit; and a second inverter between the first inverter and the buffering circuit, wherein the first routing circuit is between an input of the first inverter and an output of the second inverter.

* * * * *